United States Patent
Liu et al.

(10) Patent No.: US 12,259,448 B2
(45) Date of Patent: Mar. 25, 2025

(54) SPIN STATE READOUT DEVICE OF QUANTUM SENSOR AND SPIN STATE READOUT METHOD

(71) Applicant: Beijing Academy of Quantum Information Sciences, Beijing (CN)

(72) Inventors: Yan Liu, Beijing (CN); Renfu Yang, Beijing (CN)

(73) Assignee: Beijing Academy of Quantum Information Sciences, Beijing (CN)

( * ) Notice: Subject to any disclaimer, the term of this patent is extended or adjusted under 35 U.S.C. 154(b) by 205 days.

(21) Appl. No.: 18/319,119

(22) Filed: May 17, 2023

(65) Prior Publication Data
US 2024/0069127 A1    Feb. 29, 2024

(30) Foreign Application Priority Data

Aug. 30, 2022 (CN) .......................... 202211044588.1

(51) Int. Cl.
*G01R 33/26* (2006.01)
(52) U.S. Cl.
CPC ................................... *G01R 33/26* (2013.01)
(58) Field of Classification Search
CPC ...... G01R 33/26; G01R 33/323; G06N 10/40; G06N 10/00; G01N 24/10; G01N 21/6402
See application file for complete search history.

(56) References Cited

U.S. PATENT DOCUMENTS

2022/0307997 A1 * 9/2022 Meijer ................ G01R 33/032

OTHER PUBLICATIONS

A. Batalov et al., "Temporal Coherence of Photons Emitted by Single Nitrogen-Vacancy Defect Centers in Diamond Using Optical Rabi-Oscillations", Physical Review Letters 100, 077401 (2008), 4 pages.
P Neumann et al., "Excited-state spectroscopy of single NV defects in diamond using optically detected magnetic resonance", New Journal of Physics 11, (2009), 013017, 11 pages.

* cited by examiner

*Primary Examiner* — G. M. A Hyder
(74) *Attorney, Agent, or Firm* — Maier & Maier, PLLC

(57) ABSTRACT

A spin state readout device of a quantum sensor. The quantum sensor has spin-manipulable electrons. The spin state readout device includes: a pumping unit configured to emit a first laser to the quantum sensor to polarize the electron spin state of the quantum sensor; a probing unit configured to emit a second laser to the quantum sensor to make the spin-polarized quantum sensor in an excited state; a signal receiving unit configured to receive fluorescence photons emitted from the quantum sensor and convert optical signals into electrical signals; and a timing unit coupled to the probing unit and the signal receiving unit and configured to time an excited state lifetime of the quantum sensor. The spin state readout device of the quantum sensor provided can reduce spin state reading errors caused by laser power drifts, system signal collection efficiency drifts and the like.

20 Claims, 5 Drawing Sheets

SPIN STATE READOUT DEVICE OF QUANTUM SENSOR AND SPIN STATE READOUT METHOD

TECHNICAL FIELD

The invention relates to the technical field of quantum sensing, in particular to a spin state readout device of a quantum sensor, a quantum spin system comprising the same, and a spin state readout method of a quantum sensor by using the spin state readout device.

BACKGROUND

The nitrogen vacancy (NV) center in diamond is an important quantum spin platform. At room temperature, the spin coherence time of the NV center in diamond can reach the order of milliseconds, which is outstanding among solid-state quantum materials. For quantum sensing based on a single NV center in diamond, a sensitive unit only has the volume of a single atom and has an ultra-high spatial discrimination ability. Based on these characteristics, the NVcenter in diamond has great application prospects in the fields of precision measurement and biosensing.

For a long time, the spin state measurement technology based on the NV center in diamond mainly depends on the change of fluorescence intensity. An electron of the NV center in diamond has three spin states (+1, 0, −1). When in the excited state and spin ±1 state, the NV center is quite likely to relax to the metastable state and return to the ground state from the metastable state. Compared with spontaneous radiation, this process takes at least one order of magnitude longer, resulting in a low fluorescence intensity of the NV center in diamond when in the spin ±1 state. This readout scheme of the spin state is generally called optically detected magnetic resonance (ODMR).

The ODMR spin state readout scheme based on the fluorescence intensity is easily affected by system equipment and the environment. For example, the change of laser power will cause the change of the measured fluorescence intensity emitted by the NV center in diamond. In the ODMR spin state readout scheme based on the fluorescence intensity, the fluorescence intensity corresponds to the spin population. Therefore, a laser power drift will lead to a certain spin state readout error. Considering that laser power drifts are very common, although the laser power drifts under different qualities are different, different degrees of spin state readout errors will definitely be caused.

Recently, related academic research reports have demonstrated a magnetic field sensing scheme based on the excited state lifetime of a single NV center in diamond. In the magnetic field sensing scheme based on the excited state lifetime of the single NV center in diamond, the excited state lifetime of the NV center in diamond is only measured once after each spin polarization, and the effective signal photon generation rate is less than one per two microseconds, so the effective signal generation efficiency is low, the sensitivity is poor, and the measurement time is long, thus greatly reducing the efficiency and practical significance of the readout of spin state.

SUMMARY

In view of at least one defect of the prior art, the invention provides a spin state readout device of a quantum sensor, the quantum sensor has spin-manipulable electrons, and the spin state readout device comprises:

a pumping unit configured to emit a first laser to the quantum sensor to polarize the spin state of the quantum sensor;

a probing unit configured to emit a second laser to the quantum sensor to make the spin-polarized quantum sensor in an excited state;

a signal receiving unit configured to receive fluorescence photons emitted from the quantum sensor and convert optical signals into electrical signals; and a timing unit coupled to the probing unit and the signal receiving unit and configured to time an excited state lifetime of the quantum sensor.

According to one aspect of the invention, the spin state readout device further comprises: a manipulating unit configured to introduce microwave pulses to the quantum sensor to manipulate the electron spin state of the quantum sensor.

According to one aspect of the invention, the first laser comprises a continuous wave laser or a pulsed laser with a pulse interval less than a preset value, the pumping unit is further configured to: continuously emit the first laser for a first preset time period, wherein the first preset time period is greater than or equal to 1 µs.

According to one aspect of the invention, the second laser comprises a short pulse laser with a wavelength range from 440 nm to 637 nm and a pulse width range from 1 ps to 1 ns, the probing unit is further configured to: emit the second laser multiple times at intervals of a second preset time period, wherein the second preset time period is greater than or equal to 60 ns.

According to one aspect of the invention, the timing unit is further configured to: time the excited state lifetime of the quantum sensor according to the emission time of the second laser emitted by the probing unit many times.

According to one aspect of the invention, the timing unit comprises: a time-amplitude converter coupled to the probing unit and the signal receiving unit and configured to start timing according to the emission time of the second laser emitted by the probing unit and stop timing in response to the electrical signals output by the signal receiving unit.

According to one aspect of the invention, the timing unit further comprises a data processing unit coupled to the time-amplitude converter and configured to:

calculate the excited state lifetime of the quantum sensor according to timing data of the time-amplitude converter; and obtain a spin population of the quantum sensor according to the excited state lifetime.

According to one aspect of the invention, the data processing unit is further configured to: calculate and fit the timing data by using an excited state life fitting function.

According to one aspect of the invention, the spin state readout device further comprises: a control unit coupled to the pumping unit, the probing unit, the timing unit and the manipulating unit and configured to perform time sequence control on the pumping unit, the probing unit, the timing unit and the manipulating unit.

According to one aspect of the invention, the pumping unit and the probing unit each comprise:

a laser device configured to emit laser signals; and an optical adjustment module arranged downstream of an optical path of the laser device and configured to receive the laser signals and process the laser signals to form the first laser or the second laser.

According to one aspect of the invention, the signal receiving unit comprises a photodetector, the manipulating unit comprises a microwave source, and the control unit comprises a time sequence generator.

According to one aspect of the invention, the quantum sensor comprises a NV center in diamond, and the spin-manipulable electron can be manipulated to spin state 0, spin state 1 and spin state −1.

The invention further provides a quantum spin system, comprising a quantum sensor and the spin state readout device as described above.

The invention further provides a spin state readout method of a quantum sensor by using the spin state readout device as described above, comprising:
  emitting a first laser to the quantum sensor to polarize the electron spin state of the quantum sensor into by the pumping unit;
  emitting a second laser to the quantum sensor to make the spin-polarized quantum sensor in an excited state by the probing unit;
  receiving fluorescence photons emitted from the quantum sensor and converting optical signals into electrical signals, by the signal receiving unit; and
  timing an excited state lifetime of the quantum sensor by the timing unit.

According to one aspect of the invention, the spin state readout device further comprises a manipulating unit, and the method further comprises: introducing, by the manipulating unit, microwave pulses to the quantum sensor to control the electron spin state of the quantum sensor.

According to one aspect of the invention, the first laser comprises a continuous wave laser or a pulsed laser with a pulse interval less than a preset value, and the method further comprises: continuously emitting the first laser for a first preset time period by the pumping unit, wherein the first preset time period is greater than or equal to 1 µs.

According to one aspect of the invention, the second laser comprises a short pulse laser with a wavelength range from 440 nm to 637 nm and a pulse width range from 1 ps to 1 ns, and the method further comprises: emitting the second laser multiple times at intervals of a second preset time period by the probing unit, wherein the second preset time period is greater than or equal to 60 ns.

According to one aspect of the invention, the method further comprises: timing the excited state lifetime of the quantum sensor according to the emission time of the second laser emitted by the probing unit many times by the timing unit.

According to one aspect of the invention, the timing unit comprises a time-amplitude converter which is coupled to the probing unit and the signal receiving unit, and the method further comprises: starting timing according to the emission time of the second laser emitted by the probing unit, and stopping timing in response to the electrical signals output by the signal receiving unit, by the time-amplitude converter.

According to one aspect of the invention, the timing unit further comprises a data processing unit coupled to the time-amplitude converter, and the method further comprises:
  calculating the excited state lifetime of the quantum sensor according to timing data of the time-amplitude converter by the data processing unit; and
  obtaining, a spin population of the quantum sensor according to the excited state lifetime by the data processing unit.

According to one aspect of the invention, the method further comprises: calculating and fitting the timing data by using an excited state life fitting function by the data processing unit.

According to one aspect of the invention, the spin state readout device further comprises a control unit which is coupled to the pumping unit, the probing unit, the timing unit and the manipulating unit, and the method further comprises: performing time sequence control on the pumping unit, the probing unit, the timing unit and the manipulating unit by the control unit.

The invention further provides a non-transitory computer-readable storage medium having stored thereon computer-readable instructions which, when executed by a processor, cause the processor to implement the method as mentioned above.

According to the spin state readout device of the quantum sensor and the readout method provided by the invention, a plurality of short laser pulses are used to measure the excited state lifetime of the quantum sensor, and the spin population is analyzed based on the measured excited state lifetime. Compared with a common spin state readout method based on a fluorescence intensity, the invention can reduce spin state readout errors caused by laser power drifts, system signal collection efficiency drifts and the like. Compared with a spin detection method based on an excited state lifetime in the latest published academic research, the rate of productivity of the signal photons and sensitivity are doubled, thus improving the practicability of the spin measurement technology based on the excited state lifetime. The spin state readout device of the quantum sensor and the readout method provided by the invention greatly improve the sensitivity and accuracy of spin detection based on the NV center in diamond, and promote the application of the NV center in diamond in quantum sensing, quantum calculation and the like.

BRIEF DESCRIPTION OF THE DRAWINGS

In order to explain the technical scheme in the embodiments of the application more clearly, the drawings used in the description of the embodiments will be briefly introduced below. Obviously, the drawings in the following description are only for some embodiments of the application. For those of ordinary skill in the art, other drawings can be obtained from these drawings without exceeding the protection scope of this application.

DETAILED DESCRIPTION OF EMBODIMENTS

The technical solution in the embodiments of the application will be described clearly and completely with reference to the drawings in the embodiments of the application. Obviously, the described embodiments are merely illustrative ones, and are not all possible one of the application. Based on the embodiments in the application, all other embodiments obtained by those skilled in the art without creative labor are within the scope of protection in the application.

Figures 1A, 1B:
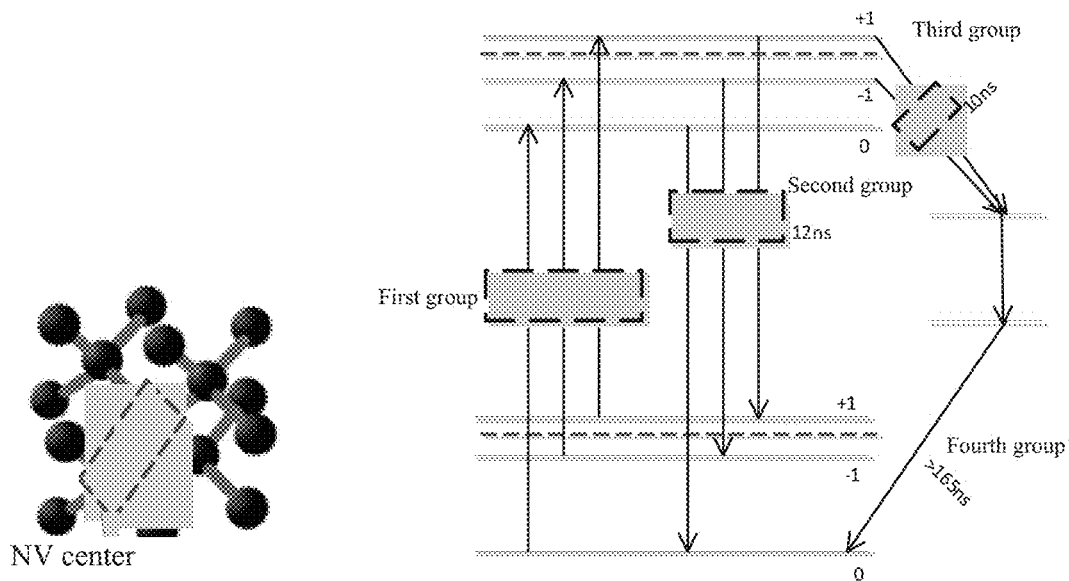
FIG. 1A shows a crystal structure of a NV center in diamond.
FIG. 1B shows the change of a NV center in diamond between a ground state, an excited state and a metastable state when electrons of the NV center in diamond undergo energy level transition and radiation.

The principle of readout of a spin state of a NV center in diamond is briefly described first. As shown in FIG. 1A, a NV center in diamond consists of a nitrogen atom which replaces a lattice position of a carbon atom and an adjacent lattice vacancy. When the NV center acquires an extra electron, the number of electrons outside a nitrogen atomic nucleus reaches six, and a pair of electrons in an S orbit can show strong transition activity, and has three spin states, that is, −1, 0, +1. Excited by a laser, electrons in a low energy level will transit to a high energy level, and the spin state of the electrons will be maintained during this process. When the NV center is in an excited state, besides spontaneous radiation, there is a certain probability of relaxation to an intermediate state. The energy level structure and transition process of the electrons of the NV center in diamond are shown in FIG. 1B.

As shown in FIG. 1B, both the ground state and the excited state of the NV center in diamond have three spin states. The first group of arrows indicates that the electrons of the NV center transit from a low energy level to a high energy level, and the spin state of the electrons remains unchanged (the NV center changes from the ground state to the excited state); the second group of arrows indicates that the electrons of the NV center spontaneously radiate from a high energy level to a low energy level (the NV center changes from the excited state to the ground state); the third group of arrows indicates that the electrons of the NV center have no radiative transition from a high energy level to an intermediate energy level; and the fourth group of arrows indicates that the electrons of the NV center have no radiative transition from an intermediate energy level to a low energy level (the NV center relaxes from the excited state to the intermediate state and returns to the ground state from the intermediate state).

Figure 2:
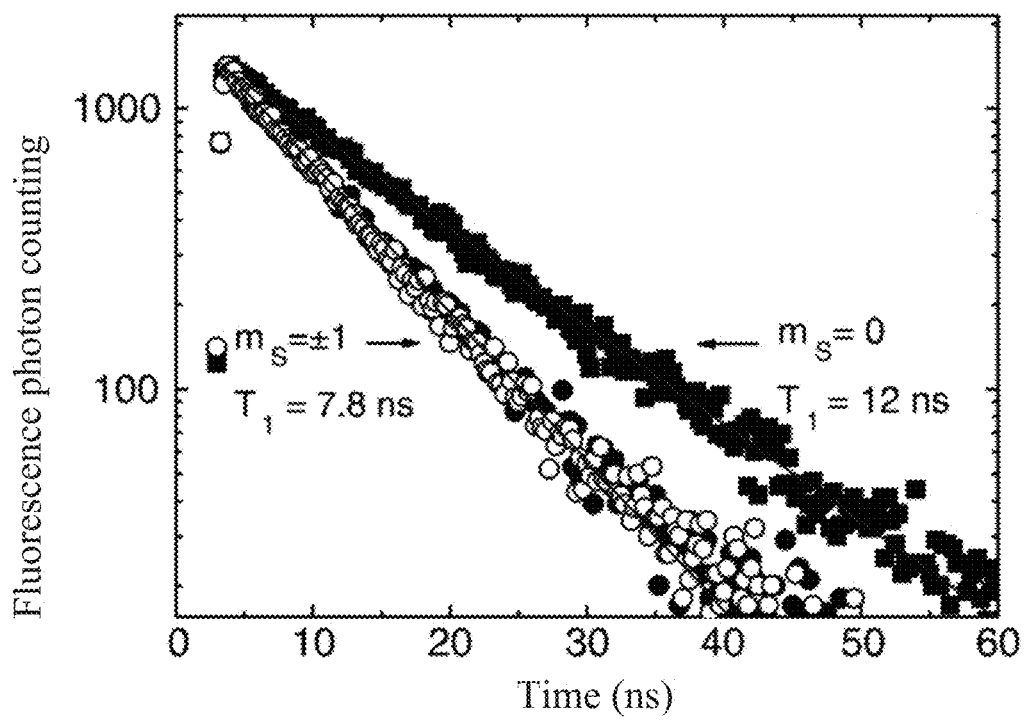
FIG. 2 shows the dependence of an excited state lifetime of an NV center in bulk diamond on its electron spin state.
Figure 3:
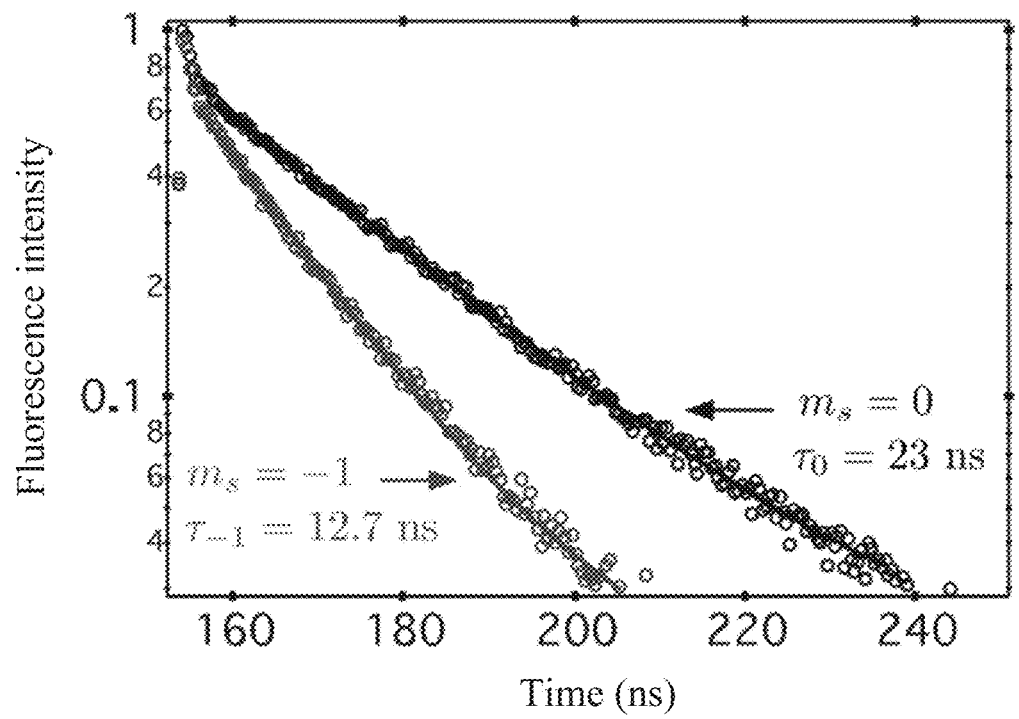
FIG. 3 shows the dependence of an excited state lifetime of an NV center in nano-diamond particles on its electron spin state.

Each group of arrows indicates the time required for the corresponding process. From FIG. 1B, it can be seen that the NV center in the excited state, that is, the ±1 spin state, is quite likely to relax to the intermediate state and return to the ground state, that is, the 0 spin state, from the intermediate state. The excited state lifetime of the NV center is strongly dependent on the spin state of its electrons, as shown in FIGS. 2 and 3. FIG. 2 shows the dependence of an excited state lifetime of an NV center in bulk diamond on its electron spin state, and FIG. 3 shows the dependence of an excited state lifetime of an NV center in nano-diamond particles on its electron spin state. It should be noted that the data of FIGS. 2 and 3 are from published papers "Temporal Coherence of Photons Emitted by Single Nitrogen-Vacancy Defect Centers in Diamond Using Optical Rabi-Oscillations (A. Batalov et al. Physical Review Letters 100, 077401 (2008)", and "Excited-state spectroscopy of single NV defects in diamond using optically detected magnetic resonance (P Neumann et al. New Journal of Physics 11 (2009) 013017 (10 pp))".

Based on the above theory, the invention provides a spin state readout device of a quantum sensor and a spin state readout method. A plurality of short laser pulses are used to measure an excited state lifetime of the quantum sensor, and a spin population is analyzed based on the measured excited state lifetime. Compared with a scheme of measuring a fluorescence intensity, a slight laser power drift will not affect the excited state life of the quantum sensor, and the measurement accuracy will not drift with the extension of measurement time, so that the readout accuracy of the spin state of the quantum sensor can be improved, thus improving the sensing accuracy of the quantum sensor and the readout of the coupling and interaction of the spin state more accurately.

Figure 4:
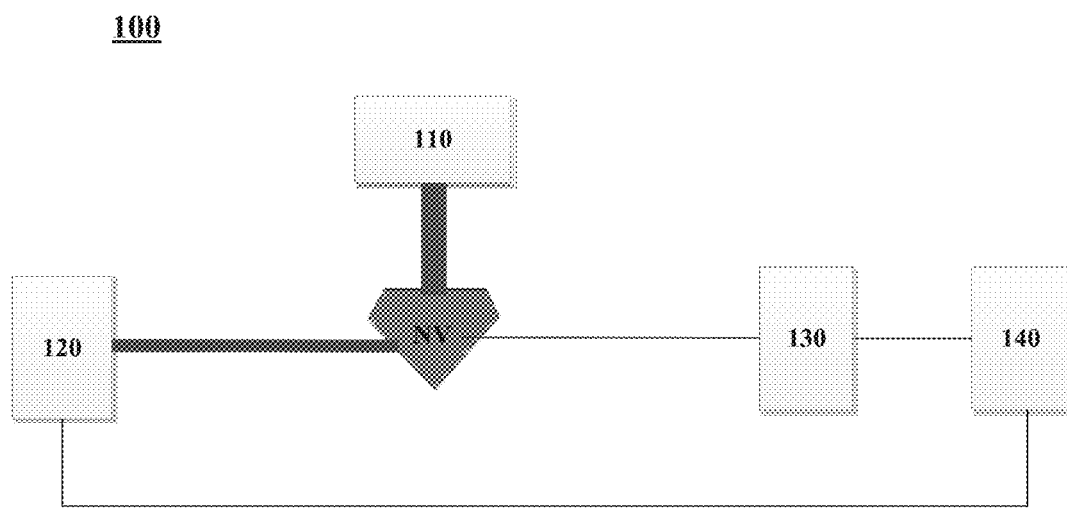
FIG. 4 shows a spin state readout device of a quantum sensor provided by an embodiment of the invention.

According to an embodiment of the invention, as shown in FIG. 4, the invention provides a spin state readout device 100 of a quantum sensor, the quantum sensor has spin-manipulable electrons, and the spin state readout device 100 comprises a pumping unit 110, a probing unit 120, a signal receiving unit 130 and a timing unit 140.

The pumping unit 110 is configured to emit a first laser to the quantum sensor to polarize the electron spin state of the quantum sensor. The pumping unit 110 is configured to emit an effective excitation laser to continuously excite a NV center in diamond, thus realizing the polarization of the electron spin state of the NV center in diamond.

According to an embodiment of the invention, the first laser comprises a continuous wave laser or a compact pulse sequence, that is, a pulse laser with a pulse interval less than a preset value (for example, a pulse laser with a pulse interval less than 10 ns), the pumping unit 110 is further configured to: continuously emit the first laser for a first preset time period, and the first preset time period is greater than or equal to 1 μs. Continuous laser excitation can polarize the electrons of the NV center in diamond into spin state 0.

The probing unit 120 is configured to emit a second laser to the quantum sensor to make the spin-polarized quantum sensor in an excited state. The probing unit 120 is configured to irradiate the NV center in diamond with a short laser pulse, so as to realize excitation of the NV center in diamond at a time and make the electrons of the NV center transit to a high energy level.

According to an embodiment of the invention, the second laser comprises a short pulse laser, the wavelength of the second laser is not particularly limited because the NV center in diamond can be efficiently excited by a blue-green laser. Generally, the wavelength range of the short pulse laser is from 440 nm to 637 nm, and the pulse width range is from 1 ps to 1 ns. The probing unit 120 is further configured to: emit the second laser multiple times at intervals of a second preset time period, the second preset time period being greater than or equal to 60 ns. The probing unit 120 is configured to irradiate the NV center in diamond with the short laser pulse multiple times to realize multiple times of excitation of the NV center in diamond.

The signal receiving unit 130 is configured to receive fluorescence photons emitted from the quantum sensor and convert optical signals into electrical signals, wherein the signal receiving unit 130 comprises a photodetector.

The timing unit 140 is coupled to the probing unit 120 and the signal receiving unit 130, and configured to time the excited state lifetime of the quantum sensor. The timing unit 140 and the signal receiving unit 130 work together to record the emission time of the fluorescence photons emitted by the NV center in diamond fluorescence photons.

According to an embodiment of the invention, the timing unit 140 is further configured to: time the excited state lifetime of the quantum sensor according to the emission time of the second laser emitted by the probing unit 120 many times. That is, the above steps of excitation at a time and excited state lifetime timing are repeated. The probing unit 120 emits short laser pulses many times to make the NV center in diamond in the excited state. The signal receiving unit 130 receives fluorescence photons emitted from the NV center in diamond and converts optical signals into electrical signals. The timing unit 140 times the excited state lifetime of the NV center in diamond many times in response to the electrical signals, and obtains statistical results of the excited state lifetime of the NV center in diamond.

Figure 5:
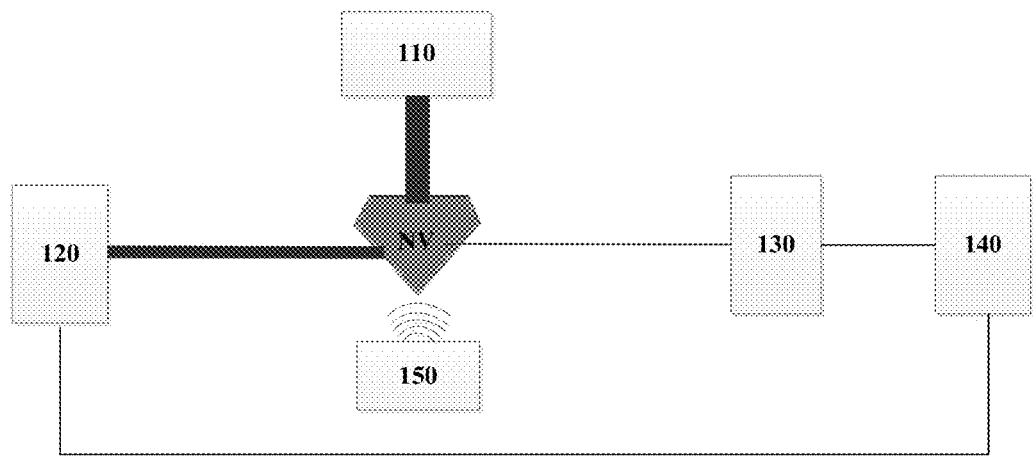
FIG. 5 shows a spin state readout device of a quantum sensor provided by an embodiment of the invention.

According to an embodiment of the invention, as shown in FIG. 5, the spin state readout device 100 further comprises a manipulating unit 150.

The manipulating unit 150 is configured to introduce microwave pulses to the quantum sensor to manipulate the electron spin state of the quantum sensor. The manipulating unit 150 comprises a microwave source, and the spin state of the quantum sensor is manipulated by introducing microwave pulses through the manipulating unit 150, for example, the electrons of the NV center in diamond are manipulated from the spin state 0 to the spin state 1 or −1.

Figure 6:
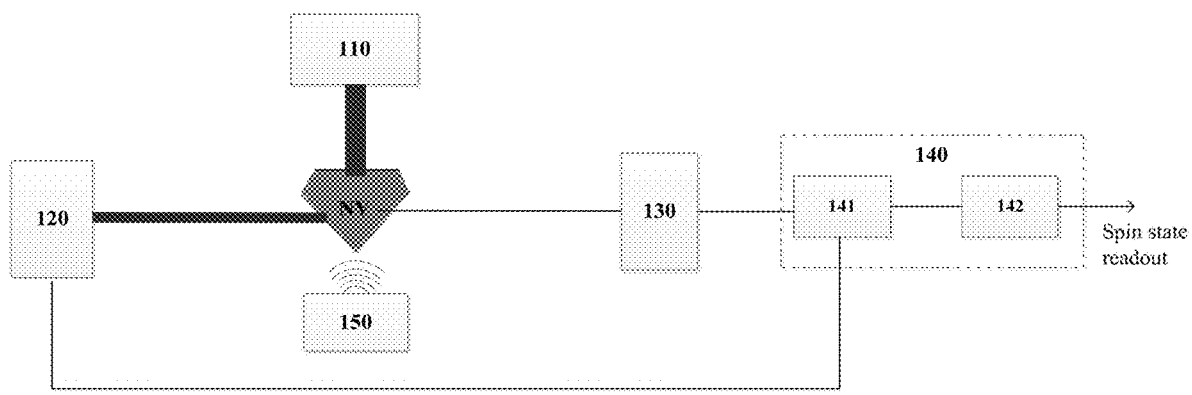
FIG. 6 shows a spin state readout device of a quantum sensor provided by an embodiment of the invention.

According to an embodiment of the invention, as shown in FIG. 6, in the spin state readout device 100, the timing unit 140 comprises a time-amplitude converter 141 and a data processing unit 142.

The time-amplitude converter 141 is coupled to the probing unit 120 and the signal receiving unit 130 and configured to start timing according to the emission time of the second laser emitted by the probing unit 120 and stop timing in response to the electrical signals output by the signal receiving unit 130.

The data processing unit 142 is coupled to the time-amplitude converter 141 and configured to:
- calculate the excited state lifetime of the quantum sensor according to timing data of the time-amplitude converter 141, wherein the data processing unit 142 obtains the results that the time-amplitude converter 141 times from the excitation of the NV center in diamond to the spontaneous emission of the fluorescence NV photons (the excited state lifetime of the NV center in diamond) many times, and synthesizes the multiple timing results to obtain the excited state lifetime of the NV center in diamond statistically; and
- obtain a spin population of the quantum sensor according to the excited state lifetime, wherein optionally, the data processing unit 142 is further configured to calculate and fit the timing data using an excited state life fitting function; for example, the multiple timing results are fitted by an E exponential function.

Figure 7:
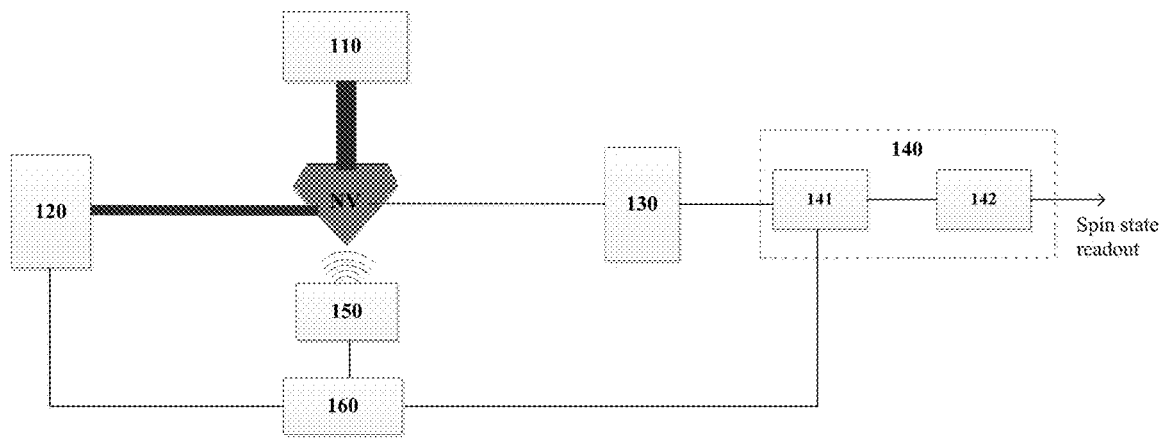
FIG. 7 shows a spin state readout device of a quantum sensor provided by an embodiment of the invention.

According to an embodiment of the invention, as shown in FIG. 7, the spin state readout device 100 further comprises a control unit 160.

The control unit 160 is coupled to the probing unit 120, the timing unit 140 and the manipulating unit 150, and configured to perform time sequence control on the probing unit 120, the timing unit 140 and the manipulating unit 150.

The control unit 160 is also coupled to the pumping unit 110 and configured to control the time sequence of the pumping unit 110 emitting/stopping emitting the first laser.

Optionally, the control unit 160 comprises a time sequence generator, such as an arbitrary waveform generator, a data acquisition card, etc. The control unit 160 controls the probing unit 120 to emit the second laser to the quantum sensor, triggers the manipulating unit 150 to introduce microwave pulses to regulate the spin state of the spin-polarized electrons, and also triggers the time-amplitude converter 141 to start timing at the same time. The signal receiving unit 130 receives the fluorescence photons emitted by the quantum sensor and converts the optical signals into the electrical signals, and the time-amplitude converter 141 stops timing in response to the electrical signals. According to an interval between the start and stop of the timing of the time-amplitude converter 141, that is, the time recorded by the time-amplitude converter 141, the excited state lifetime of the excitation at this time is obtained.

Figure 8:
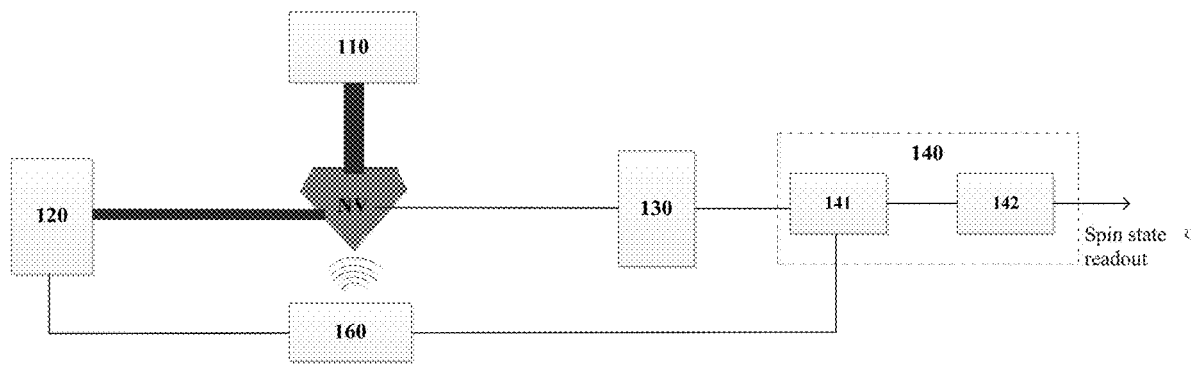
FIG. 8 shows a spin state readout device of a quantum sensor provided by an embodiment of the invention.

In other embodiments of the invention, as shown in FIG. 8, the control unit 160 comprises an arbitrary waveform generator, and can be used as the manipulating unit 150 at the same time. The control unit 160 is configured to trigger the probing unit 120 to emit the second laser to the quantum sensor, and trigger the time-amplitude converter 141 to start timing. At the same time, the control unit 160 generates microwave pulses and introduces the same into the quantum sensor to regulate the spin state of the spin-polarized electrons.

In some of the above embodiments, the pumping unit 110 emits the first laser to the quantum sensor to polarize the electron spin state of the quantum sensor, the manipulating unit 150 introduces the microwave pulses to the quantum sensor to manipulate the electron spin state of the quantum sensor, and the probing unit 120 emits the second laser to the quantum sensor to make the spin-polarized quantum sensor at the starting point of the excited state. Manipulation can be made, the time interval between the three operations can be within a preset range, and the time sequence can be controlled by the control unit 160, all of which are within the protection scope of the invention.

According to an embodiment of the invention, the control unit 160 stores a preset program, which is suitable for performing time sequence control on the pumping unit 110, the probing unit 120, the manipulating unit 150 and the timing unit 140. The control unit 160 runs the preset program so that the pumping unit 110 emits an effective laser to polarize the electron spin state of the quantum sensor; then the probing unit 120 emits short-pulse lasers to the quantum sensor many times to make the spin-polarized electrons transit to a high energy level, that is, make the NV center in diamond in an excited state; the manipulating unit 150 introduces microwave pulses into the quantum sensor many times to manipulate the spin state of the spin-polarized electrons; and the timing unit 140 starts timing while the probing unit 120 emits the short-pulse lasers, and stops timing in response to the electrical signals output by the signal receiving unit 130. By running the preset program through the control unit 160, the spin state readout device 100 of the quantum sensor can automatically run. Finally, the time-amplitude converter 141 transmits the collected statistical data to the data processing unit 142 (such as a computer) for data fitting and analysis, so as to complete the readout of the spin state of the quantum sensor.

According to one embodiment of the invention, in the spin state readout device 100, the pumping unit 110 and the probing unit 120 each comprise a laser device and an optical adjustment module.

The laser device is configured to emit laser signals.

The optical adjustment module is arranged downstream of an optical path of the laser device and configured to receive the laser signals and process the laser signals to form the first laser or the second laser.

According to an embodiment of the invention, in the spin state readout device 100, the quantum sensor comprises a NV center in diamond, and the spin-manipulable electron has a spin state 0, a spin state +1 and a spin state −1. The number of the NV centers in diamond as quantum sensors can be one, or an ensemble may be formed by multiple color centers, and diamond samples can be micron-sized, nano-sized particles or millimeter-sized, which are all within the protection scope of the invention.

According to an embodiment of the invention, the invention also provides a quantum spin system, comprising a quantum sensor and the spin state readout device 100 of the quantum sensor as described above.

The spin state readout device of the quantum sensor and the quantum spin system provided by the above embodiments of the invention can be applied to spin state readout of spin control sequences such as Rabi oscillation sequence, Ramsey sequence and spin echo.

Based on the spin-state readout device 100 of the quantum sensor described above, the invention can be extended to a variety of practical application modes by changing the type of the signal receiving unit 130 (comprising a photodetector, for example) or changing the ways of exciting the NV center and collecting signals, including but not limited to: a high spatial discrimination system based on a fluorescent confocal microscope; a couple optical fiber system based on micron diamond; a wide-field imaging device based on a multi-pixel photodetector; and a microfluidic diagnostic instrument for medical clinical diagnosis.

Figure 9:
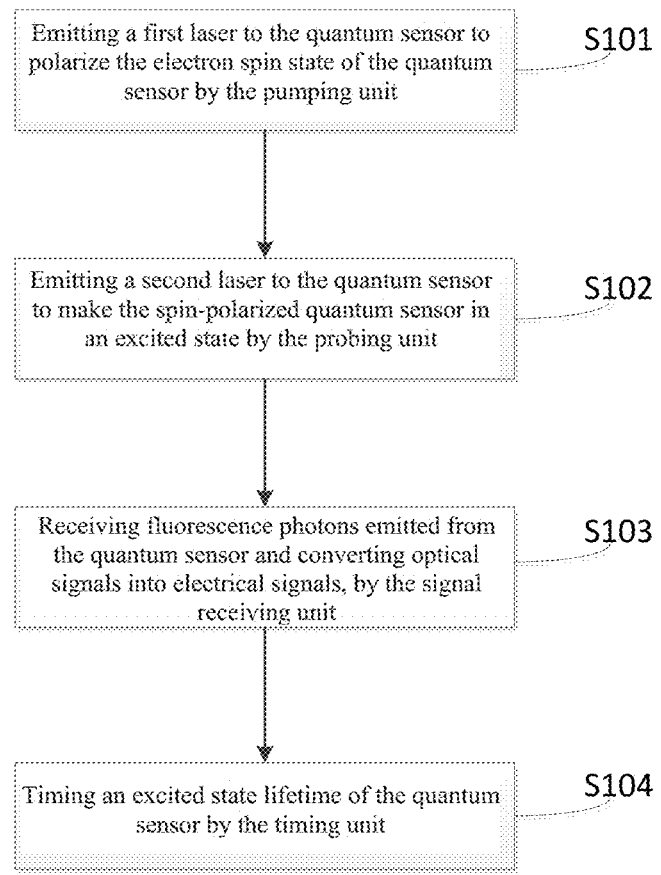
FIG. 9 shows a spin state readout method of a quantum sensor according to an embodiment of the invention.

According to an embodiment of the invention, as shown in FIG. 9, the invention also provides a spin state readout method 10 of a quantum sensor by using the spin state readout device 100 as described above, comprising steps S101 to S104. Wherein, In S101, the pumping unit emits a first laser to the quantum sensor to polarize the electron spin state of the quantum sensor.

In S102, the probing unit emits a second laser to the quantum sensor to make the spin-polarized quantum sensor in in an excited state.

In S103, the signal receiving unit receives fluorescence photons emitted from the quantum sensor, and converts optical signals into electrical signals.

In S104, the timing unit times an excited state lifetime of the quantum sensor.

According to an embodiment of the invention, the spin state readout device further comprises an manipulating unit, and the method 10 further comprises: introducing, by the manipulating unit, microwave pulses to the quantum sensor to manipulate the electron spin state of the quantum sensor.

According to an embodiment of the invention, the first laser comprises a continuous wave laser or a pulsed laser with a pulse interval less than a preset value, and the method 10 further comprises: continuously emitting, by the pumping unit, the first laser for a first preset time period, wherein the first preset time period is greater than or equal to 1 µs.

According to an embodiment of the invention, the second laser comprises a short pulse laser with a wavelength range from 440 nm to 637 nm and a pulse width range from 1 ps to 1 ns, and the method 10 further comprises: emitting, by the probing unit, the second laser multiple times at intervals of a second preset time period, wherein the second preset time period is greater than or equal to 60 ns.

According to an embodiment of the invention, the method 10 further comprises: timing, by the timing unit, the excited state lifetime of the quantum sensor many times according to the emission time of the second laser emitted by the probing unit many times.

According to an embodiment of the invention, the timing unit comprises a time-amplitude converter which is coupled to the probing unit and the signal receiving unit, and the method 10 further comprises: starting timing according to the emission time of the second laser emitted by the probing unit, and stopping timing in response to the electrical signals output by the signal receiving unit, by the time-amplitude converter.

According to an embodiment of the invention, the timing unit further comprises a data processing unit coupled to the time-amplitude converter, and the method 10 further comprises:

calculating, by the data processing unit, the lifetime of the quantum sensor according to timing data of the time-amplitude converter; and obtaining, by the data processing unit, a spin population of the quantum sensor according to the excited state lifetime.

According to an embodiment of the invention, the method 10 further comprises: calculating and fitting, by the data processing unit, the timing data by using an excited state life fitting function.

According to an embodiment of the invention, the spin state readout device further comprises a control unit which is coupled to the pumping unit, the probing unit, the timing unit and the manipulating unit, and the method 10 further comprises: performing, by the control unit, time sequence control on the pumping unit, the probing unit, the timing unit and the manipulating unit.

The specific definition of the spin state readout method 10 of the quantum sensor is similar to that of the spin state readout device 100 of the quantum sensor. Please refer to the introduction of the spin state readout device 100 of the quantum sensor above, which is not repeated here.

The invention further provides a non-transitory computer-readable storage medium having stored thereon computer-readable instructions which, when executed by a processor, cause the processor to implement the method 10 as mentioned above.

According to the spin state readout device of the quantum sensor and the readout method provided by the invention, a plurality of short laser pulses are used to measure the excited state lifetime of the quantum sensor, and the spin population is analyzed based on the measured excited state lifetime. Compared with a common spin state readout method based on a fluorescence intensity, the invention can reduce spin state readout errors caused by laser power drifts, system signal collection efficiency drifts and the like. Compared with a spin detection method based on an excited state lifetime in the latest published academic research, the productivity of signal photons and sensitivity are doubled, thus improving the practicability of the spin measurement technology based on the excited state lifetime. The spin state readout device of the quantum sensor and the readout method provided by the invention greatly improve the sensitivity and accuracy of spin detection based on the NV center in diamond, and promote the application of the NV center in diamond in quantum sensing, quantum calculation and the like.

The embodiments of the application have been introduced in detail above. Specific examples are applied herein to illustrate the principle and implementation of the application. The above embodiments are only used to help understand the method of the application and its core ideas. The changes or deformations made by those skilled in the art based on the ideas of the application and the specific implementation and application scope of the application are within the scope of protection of the application. To sum up, the content of this specification should not be construed as a limitation of the application.

What is claimed is:

1. A spin state readout device of a quantum sensor, the quantum sensor having spin-manipulable electrons, the spin state readout device comprising:
    a pumping unit configured to emit a first laser to the quantum sensor to polarize an electron spin state of the quantum sensor;
    a probing unit configured to emit a second laser to the quantum sensor to make the spin-polarized quantum sensor in an excited state;
    a signal receiving unit configured to receive fluorescence photons emitted from the quantum sensor and convert optical signals into electrical signals; and
    a timing unit coupled to the probing unit and the signal receiving unit and configured to time an excited state lifetime of the quantum sensor.

2. The spin state readout device according to claim 1, further comprising:
    a manipulating unit configured to introduce microwave pulses to the quantum sensor to manipulate the electron spin state of the quantum sensor.

3. The spin state readout device according to claim 2, further comprising:
    a control unit coupled to the pumping unit, the probing unit, the timing unit and the manipulating unit and configured to perform time sequence control on the pumping unit, the probing unit, the timing unit and the manipulating unit,
    wherein the signal receiving unit comprises a photodetector, the manipulating unit comprises a microwave source, and the control unit comprises a time sequence generator.

4. The spin state readout device according to claim 1, wherein the first laser comprises a continuous wave laser or a pulsed laser with a pulse interval less than a preset value, and the pumping unit is further configured to:
    continuously emit the first laser for a first preset time period, wherein the first preset time period is greater than or equal to 1 µs.

5. The spin state readout device according to claim 1, wherein the second laser comprises a short pulse laser with a wavelength range from 440 nm to 637 nm and a pulse width range from 1 ps to 1 ns, and the probing unit is further configured to:
    emit the second laser multiple times at intervals of a second preset time period, wherein the second preset time period is greater than or equal to 60 ns.

6. The spin state readout device according to claim 5, wherein the timing unit is further configured to:
    time the excited state lifetime of the quantum sensor multiple times according to emission time of the second laser emitted multiple times by the probing unit.

7. The spin state readout device according to claim 1, wherein the timing unit comprises:
    a time-amplitude converter coupled to the probing unit and the signal receiving unit and configured to start timing according to emission time of the second laser emitted by the probing unit and stop timing in response to the electrical signals output by the signal receiving unit.

8. The spin state readout device according to claim 7, wherein the timing unit further comprises a data processing unit coupled to the time-amplitude converter and configured to:
    calculate the excited state lifetime of the quantum sensor according to timing data of the time-amplitude converter; and
    obtain a spin population of the quantum sensor according to the excited state lifetime.

9. The spin state readout device according to claim 8, wherein the data processing unit is further configured to:
    calculate and fit the timing data by using an excited state life fitting function.

10. The spin state readout device according to claim 1, wherein the pumping unit and the probing unit each comprise:
    a laser device configured to emit laser signals; and
    an optical adjustment module arranged downstream of an optical path of the laser device and configured to receive the laser signals and process the laser signals to form the first laser or the second laser.

11. The spin state readout device according to claim 1, wherein the quantum sensor comprises a NV center in diamond, and the spin-manipulable electron can be manipulated to spin state 0, spin state +1 or spin state −1.

12. A quantum spin system, comprising a quantum sensor and the spin state readout device according to claim 1.

13. A spin state readout method of a quantum sensor by using the spin state readout device according to claim 1, comprising:
    emitting, by the pumping unit, a first laser to the quantum sensor to polarize the electron spin state of the quantum sensor;
    emitting, by the probing unit, a second laser to the quantum sensor to make the spin-polarized quantum sensor in an excited state;
    receiving fluorescence photons emitted from the quantum sensor and converting optical signals into electrical signals by the signal receiving unit; and
    timing, by the timing unit, an excited state lifetime of the quantum sensor.

14. The method according to claim 13, wherein the spin state readout device further comprises a manipulating unit, and the method further comprises:
    introducing by the manipulating unit microwave pulses to the quantum sensor to manipulate the electron spin state of the quantum sensor.

15. The method according to claim 13, wherein the first laser comprises a continuous wave laser or a pulsed laser with a pulse interval less than a preset value, and the method further comprises:
    continuously emitting the first laser for a first preset time period by the pumping unit, wherein the first preset time period is greater than or equal to 1 µs.

16. The method according to claim 13, wherein the second laser comprises a short pulse laser with a wavelength range from 440 nm to 637 nm and a pulse width range from 1 ps to 1 ns, and the method further comprises:

emitting the second laser multiple times at intervals of a second preset time period by the probing unit, wherein the second preset time period is greater than or equal to 60 ns; and timing by the timing unit the excited state lifetime of the quantum sensor multiple times according to emission time of the second laser emitted multiple times by the probing unit.

17. The method according to claim 13, wherein the timing unit comprises a time-amplitude converter coupled to the probing unit and the signal receiving unit, and the method further comprises:

starting timing according to emission time of the second laser emitted by the probing unit and stopping timing in response to the electrical signals output by the signal receiving unit, by the time-amplitude converter.

18. The method according to claim 17, wherein the timing unit further comprises a data processing unit coupled to the time-amplitude converter, and the method further comprises:

calculating by the data processing unit the excited state lifetime of the quantum sensor according to timing data of the time-amplitude converter; and obtaining by the data processing unit a spin population of the quantum sensor according to the excited state lifetime.

19. The method according to claim 18, further comprising:

calculating and fitting by the data processing unit the timing data by using an excited state life fitting function.

20. The method according to claim 13, wherein the spin state readout device further comprises a control unit coupled to the pumping unit, the probing unit, the timing unit and the manipulating unit, and the method further comprises:

performing by the control unit time sequence control on the pumping unit, the probing unit, the timing unit and the manipulating unit.

* * * * *